US008880005B2

(12) United States Patent
Maerzinger et al.

(10) Patent No.: US 8,880,005 B2
(45) Date of Patent: Nov. 4, 2014

(54) TRANSCEIVER WITH CASCADED PHASE-LOCKED LOOPS

(75) Inventors: Guenter Maerzinger, Linz (AT); Bernd Adler, Neubiberg (DE)

(73) Assignee: Intel Mobile Communications GmbH, Neubiberg (DE)

( * ) Notice: Subject to any disclaimer, the term of this patent is extended or adjusted under 35 U.S.C. 154(b) by 2120 days.

(21) Appl. No.: 11/685,288

(22) Filed: Mar. 13, 2007

(65) Prior Publication Data
US 2007/0275672 A1    Nov. 29, 2007

(30) Foreign Application Priority Data
Mar. 14, 2006   (DE) .......................... 10 2006 011 682

(51) Int. Cl.
*H04B 1/40* (2006.01)
*H04M 1/00* (2006.01)
*H03L 7/23* (2006.01)

(52) U.S. Cl.
CPC ....................................... *H03L 7/23* (2013.01)
USPC .............................. 455/76; 455/86; 455/550.1

(58) Field of Classification Search
CPC ............ H04B 1/38; H04B 1/40; H04B 1/401; H04B 1/403; H04B 1/44; H04B 1/48; H03L 7/23; H03L 7/24
USPC .......................... 455/73, 75, 76, 86, 87, 550.1
See application file for complete search history.

(56) References Cited

U.S. PATENT DOCUMENTS

| 5,276,913 | A  | * | 1/1994  | Lee et al. ........................ 455/76 |
| 5,574,986 | A  | * | 11/1996 | Mobach .......................... 455/76 |
| 6,484,038 | B1 | * | 11/2002 | Gore et al. ................... 455/552.1 |
| 6,621,853 | B1 | * | 9/2003  | Ku ................................. 375/132 |
| 6,735,426 | B1 | * | 5/2004  | Pau ............................... 455/255 |
| 6,738,602 | B1 | * | 5/2004  | Heinen et al. .................. 455/76 |
| 7,120,427 | B1 | * | 10/2006 | Adams et al. ................. 455/418 |
| 2002/0147014 | A1 | * | 10/2002 | Atarius et al. ................ 455/436 |
| 2003/0078011 | A1 | * | 4/2003  | Cheng et al. .................... 455/73 |
| 2003/0190903 | A1 | * | 10/2003 | Melamed .................... 455/277.1 |
| 2004/0152484 | A1 | * | 8/2004  | Pratt ........................... 455/552.1 |
| 2005/0250464 | A1 | * | 11/2005 | Spencer et al. ............... 455/260 |

FOREIGN PATENT DOCUMENTS

| DE | 19913110 C1 | 11/2000 |
| DE | 19938515 A1 | 3/2001 |

OTHER PUBLICATIONS

Reza Navid et al; Minimum Achievable Phase Noise of RC Oscillators; IEEE Journal of Solid-State Circuits; Mar. 2005; pp. 630-636; vol. 40, No. 3.

Axcelerator Family PLL and Clock Management; Actel Application Note; pp. 1-7; Jun. 2003.

Hajimiri et al; Jitter and Phase Noise in Ring Oscillators; IEEE Journal of Solid-State Circuits; Jun. 1999: pp. 790-804; vol. 34. No. 6.

* cited by examiner

*Primary Examiner* — Andrew Wendell
(74) *Attorney, Agent, or Firm* — Schwegman Lundberg & Woessner, P.A.

(57) ABSTRACT

A transceiver comprising a first frequency signal generator for generating a reception frequency signal, and a second frequency signal generator for generating a transmission frequency signal. The first frequency signal generator is coupled to the second frequency signal generator to supply the reception frequency signal to the second frequency signal generator as a reference frequency signal.

7 Claims, 2 Drawing Sheets

US 8,880,005 B2

TRANSCEIVER WITH CASCADED PHASE-LOCKED LOOPS

RELATED APPLICATION INFORMATION

This application claims priority to German Patent Application DE 10 2006 011 682.8-35 filed on Mar. 14, 2006.

FIELD OF THE INVENTION

The present invention relates to a transceiver. In particular, the present invention relates to a transceiver for example for use in a communication system.

BACKGROUND

A transceiver is used to transmit information in a communication system, e.g. a mobile radio system or a wire-based communication system. The transceiver architecture for implementing broadband transmission standards, such as UMTS (Universal Mobile Telecommunications System), requires the generation of suitable clock signals for use in the respective standard. In a common communication system the clock signal is too high to be generated directly using a crystal oscillator. Therefore, oscillator circuitry is provided to generate the clock signal.

While transmission frequencies used in a communication system are becoming higher, the interference between the transmission signal and clock signals is getting more important. The interference may cause degradation in the quality of signal transmission. In consequence, increased demands are imposed on a spectral purity of the clock signals. In particular, the clock signal should have a minimum amount of phase noise (jitter).

As soon as clock signals at a higher frequency are required, a DLL (Delay-Locked Loop) circuit may be used to multiply the frequency of the crystal oscillator. A DLL circuit is a control loop in which an oscillator is stabilized by means of a reference frequency signal. The spectral purity of the clock generated in this manner is sufficient to supply a clock signal to digital blocks such as DSP (Digital Signal Processing) blocks and digital/analogue converters (DACs), for example. However, the quality of a clock signal generated in a DLL is insufficient in terms of the spectral purity required. It may not be used as a reference signal for a so-called phase-locked loop (PLL) to generate the transmission signal. For this and other reasons, there is a need for the present invention.

SUMMARY OF THE INVENTION

One embodiment of the invention is a transceiver comprising a first frequency signal generator and a second frequency signal generator. The first frequency signal generator generates a reception frequency signal, while the second frequency signal generator generates a transmission frequency signal. The first frequency signal generator couples to the second frequency signal generator to feed the reception frequency signal to the second frequency signal generator as a reference frequency signal.

Another embodiment of the invention is an apparatus comprising: a modulator; a demodulator; and a cascaded phase-locked loop including a first phase-locked loop having an output and a second phase-locked loop having a reference input and a second output, wherein the output couples to the demodulator and to the reference input, and wherein the second output couples to the modulator.

BRIEF DESCRIPTION OF THE DRAWINGS

The accompanying drawings are included to provide a further understanding of the invention and are incorporated in and constitute a part of this specification. The drawings illustrate the embodiments of the invention and together with the description serve to explain the principles of the invention. Other embodiments of the invention and many of the intended advantages of the invention will be readily appreciated as they become better understood by reference to the following description. Like references numerals designate corresponding similar parts.

DETAILED DESCRIPTION OF THE INVENTION

Figure 1:
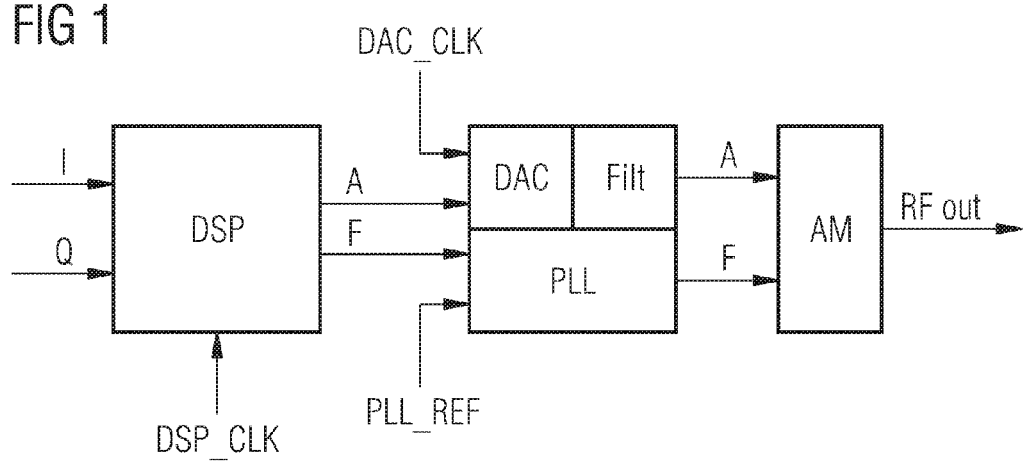
FIG. 1 illustrates a block diagram of a polar modulator of a mobile radio.

FIG. 1 illustrates the block diagram of a polar modulator of a mobile radio. The polar modulator comprises blocks, which impose increased demands on clock signals used in the system. A digital signal processor DSP, to which input signals I and Q are applied, requires a high operating frequency DSP-CLK. In this case, a signal I indicates the real part of a complex baseband signal. A second signal Q represents the imaginary part of said baseband signal.

A digital/analogue converter DAC requires both a high operating frequency and a high spectral purity of the applied clock signals $DAC_{CLK}$. A phase-locked loop PLL, which is used as a phase modulator also requires a high operating frequency with a high spectral purity of the clock signals $PLL_{REF}$.

An output signal from the digital signal processor DSP makes use of a polar representation having an amplitude component A and a phase component F. The amplitude signal A is injected into a digital/analogue converter DAC and the phase signal F is injected into a phase-locked loop PLL.

For use as a polar modulator, the amplitude signal A is applied to the corresponding amplitude signal input A of an amplitude modulator AM via the digital/analogue converter DAC and a filter Filt, while the output signal from the phase-locked loop is injected into the phase signal input F of the amplitude modulator AM. The amplitude modulator generates a radio-frequency signal $RF_{out}$ and provides it to its output.

Figure 2:
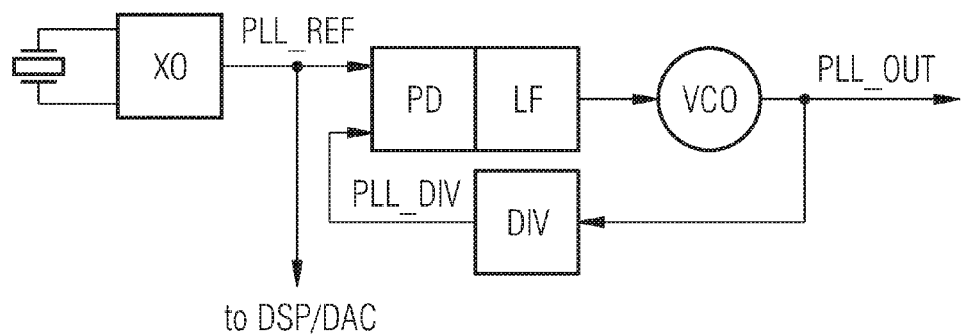
FIG. 2 illustrates a block diagram of a phase-locked loop with an external crystal oscillator for generating a reference.

FIG. 2 shows a phased-locked loop in which the reference frequency PLLREF is fed into a phase detector PD from an external crystal oscillator XO. An output signal of the phase detector PD is applied to a voltage-controlled oscillator (VCO) via a loop filter LF. The VCO generates an output signal $PLL_{out}$. The output signal $PLL_{out}$ is fed back into the phase detector PD via a divider element DIV. Furthermore the output signal $PLL_{put}$ is provided at an output of the phase-locked-loop for further data processing.

The reference signal $PLL_{REF}$ may be simultaneously fed into a digital signal processor DSP or a digital/analogue converter DAC as a clock signal.

Figure 3:
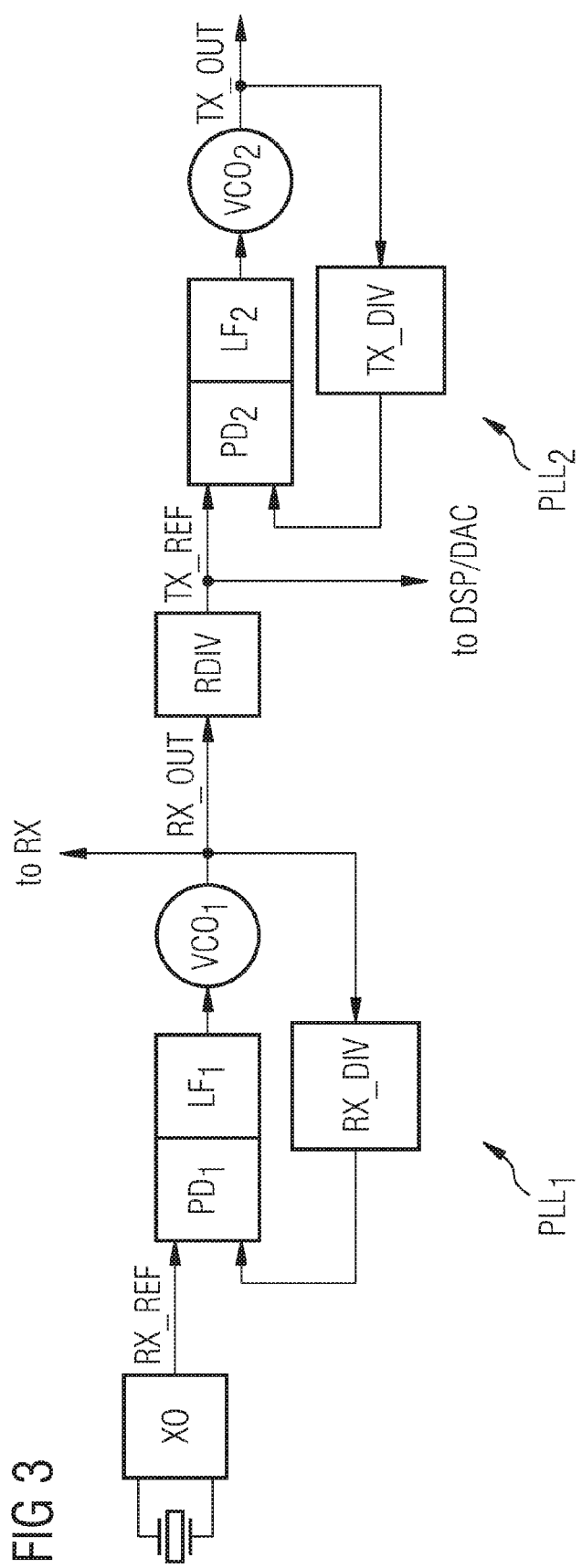
FIG. 3 illustrates an embodiment of a transceiver according to the present invention.

FIG. 3 shows the block diagram of a cascaded phased-locked loop circuit. An external crystal oscillator XO generates a reference frequency signal $RX_{REF}$ which is injected into a phase detector $PD_1$ of the first phase-locked loop $PLL_1$. The signal is injected into a voltage-controlled oscillator $VCO_1$ via a loop filter $LF_1$. The output signal $RX_{OUT}$ from said oscillator is then used, on the one hand, as a clock signal for the reception path of the mobile radio circuit. In radio-frequency technology, the signal $RX_{OUT}$ is also referred to as a local oscillator signal. The signal $RX_{OUT}$ is fed back to the phase detector $PD_1$ again via a divider element $RX_{DIV}$.

The output signal $RX_{OUT}$ from the reception phase-locked loop $PLL_1$ is injected into a second phase-locked loop $PLL_2$. The injection may be effected directly or indirectly, e.g. via a frequency divider element RDIV as shown in FIG. 3. The frequency divider element RDIV provides a reference frequency signal $TX_{REF}$ derived from the output signal $RX_{OUT}$. The reference frequency signal $TX_{REF}$ received by the second phase-locked loop $PLL_2$ is injected into a second phase detector $PD_2$. The signal $TX_{REF}$ may be used as a clock signal for the digital signal processor DSP or for the digital/analogue converter DAC. Furthermore, the signal $TX_{REF}$ is injected via a loop filter $LF_2$, into a voltage-controlled oscillator $VCO_2$. The voltage-controlled oscillator $VCO_2$ generates an output signal $TX_{OUT}$ from this second phase-locked loop $PLL_2$. The output signal $TX_{OUT}$ fed back to the second phase detector $PD_2$ via a divider element $TX_{DIV}$. Furthermore, output signal $TX_{OUT}$ is provided at an output of the second phase-locked loop $PLL_2$ for further signal processing.

The respective control loops of the two phase-locked loops $PLL_1$ and $PLL_2$, which are connected in series in cascaded fashion, are each used to ensure that the respective frequencies generated are kept stable. This results in the clock signal jitter being minimized.

A concept of the embodiment shown in FIG. 3 is that the first frequency signal generator is used to generate a spectrally pure reference frequency signal for the second frequency signal generator. A greater demand is imposed on the spectral purity and bandwidth of the second frequency signal generator, which provides a clock signal for a transmission path of the transceiver circuit arrangement, than on the first frequency signal generator which provides a clock signal for a reception path of the transceiver circuit arrangement. These demands can be resolved by using a correspondingly high and stabilized reference frequency signal. This may be effected by virtue of the reception frequency signal being used as a reference frequency signal for the second frequency signal generator.

In other words, the transceiver comprises a cascaded frequency signal generator circuit, which provides a spectrally pure clock signal at frequencies higher than a frequency of an external crystal oscillator with a sufficiently high spectral purity.

The second frequency signal generator is a phase-locked loop. The second frequency signal generator thus generates the transmission frequency signal by comparing the latter or a multiple or divided value of the latter with the reference frequency signal. The phase-locked loop can generate a stable output signal, that is to say a stable transmission frequency signal, at different frequencies.

The first frequency signal generator may be a phase-locked loop. The first frequency signal generator can advantageously generate a stable output signal, that is to say a stable reception frequency signal, at different frequencies.

The transceiver includes a crystal oscillator, which is coupled to the first frequency signal generator in order to supply a frequency signal to the latter as a first reference frequency signal. The first frequency signal generator thus has a very stable first reference frequency signal as a reference for generating the reception frequency signal.

An output of the first frequency signal generator connects to an input of the second frequency signal generator via a frequency divider in order to inject the reception frequency signal into the second frequency signal generator as a reference frequency signal. The reference frequency signal for the second frequency signal generator may thus be supplied to the second frequency signal generator at different frequencies and, in particular, at a frequency that differs from the frequency of the reception frequency signal.

The frequency divider is arranged, so that the reference frequency signal is divided down to a frequency depending on the use of the output signals, e.g. between 100 MHz and 300 MHz. The transceiver is thus operable in mobile radio systems, for example UMTS or in a wireline communication system.

The reception frequency signal is simultaneously a clock signal for a reception path of the transceiver circuit arrangement. The transmission frequency signal is a second clock signal in a transmission path of the transceiver circuit arrangement.

For use of the cascaded phased-locked loop circuit shown in FIG. 3 in a transceiver, or in more general terms in a Modulator/Demodulator circuitry, the output of the first phase-locked loop $PLL_1$ couples to a demodulator in a reception path of the transceiver. The second phase-locked loop $PLL_2$ couples to a modulator in a transmit path of the transceiver.

What is claimed is:

1. A transceiver comprising:
   a first frequency signal generator that generates a reception frequency signal;
   a crystal oscillator coupled to the first frequency signal generator to supply a frequency signal to the latter as a first reference frequency signal; and
   a second frequency signal generator that generates a transmission frequency signal,
   the first frequency signal generator being coupled to the second frequency signal generator to feed the reception frequency signal to the second frequency signal generator as a reference frequency signal.

2. The transceiver of claim 1, wherein the second frequency signal generator is a phase-locked loop.

3. The transceiver of claim 1, wherein the first frequency signal generator is a phase-locked loop.

4. The transceiver of claim 1, wherein an output of the first frequency signal generator is connected to an input of the second frequency signal generator via a frequency divider to feed the reception frequency signal into the second frequency signal generator as a reference frequency signal.

5. The transceiver of claim 4, wherein the frequency divider is arranged so that the reference frequency signal is divided down to a frequency between 100 MHz and 300 MHz.

6. The transceiver of claim 1, wherein the reception frequency signal is a first clock signal for a reception path of the transceiver circuit arrangement.

7. The transceiver of claim 1, wherein the transmission frequency signal is a second clock signal in a transmission path of the transceiver circuit arrangement.

* * * * *